United States Patent [19]

Ambro et al.

[11] Patent Number: 4,657,831
[45] Date of Patent: Apr. 14, 1987

[54] COLOR PROOFING METHOD AND ARTICLE

[75] Inventors: Joseph H. Ambro; Lawrence E. Contois, both of Rochester, N.Y.

[73] Assignee: Eastman Kodak Company, Rochester, N.Y.

[21] Appl. No.: 838,486

[22] Filed: Mar. 11, 1986

[51] Int. Cl.$^4$ .......................... G03G 13/01; G03C 7/00
[52] U.S. Cl. ........................................ 430/14; 430/18; 430/47; 430/293; 430/358
[58] Field of Search ...................... 430/14, 18, 47, 293, 430/358

[56] References Cited

U.S. PATENT DOCUMENTS

| | | | |
|---|---|---|---|
| 4,262,071 | 4/1981 | Larson | 430/11 |
| 4,329,420 | 5/1982 | Bopp | 430/18 X |
| 4,333,998 | 6/1982 | Leszyk | 430/18 X |
| 4,376,158 | 3/1983 | Spechler | 430/293 X |

*Primary Examiner*—Roland E. Martin
*Attorney, Agent, or Firm*—David F. Janci

[57] ABSTRACT

Electrophotographic color proofs of half-tone dot pattern images are made which closely simulate the dot gain of prints made with lithographic plates and liquid inks. In forming the color proof, a thin transparent plastic sheet having on one side an electrophotographic toner dot pattern image is laminated to a reflective support with the toner image side in contact with the support. A thicker transparent plastic sheet is laminated to the other side of the thin sheet. The resulting color proof comprising a toner dot pattern on a reflective support and covered by a thin transparent layer and a thicker transparent layer has an apparent increase in dot size which simulates that of a press print.

10 Claims, 3 Drawing Figures

COLOR PROOFING METHOD AND ARTICLE

FIELD OF THE INVENTION

This invention relates to color proofing and more particularly to a method for improving the fidelity of lithographic color proofs made by electrophotography and also to the novel color proofs made by the method.

BACKGROUND

In lithographic printing of color photographs, normally a set of four color-separation images of the photograph is made, one for each of the three colors used in printing, namely, cyan, magenta and yellow and one for black. These are dot pattern transparencies which are made by exposing through a screen and appropriate color filters. Then corresponding lithographic plates are made from each of the separation images and each image is printed on paper or other stock by successive, registered contact with the plates, each of which is inked with the color for the particular separation. If the separation images are accurate and if other conditions are satisfied, a good color print is obtained. If, however, one or more of the separation images is not accurate, for example, through even a minor error in development, the color print will be out of balance. If the error is not discovered before the plates are made or before printing begins much waste will occur. Consequently, color proofing before the printing run begins is essential.

Color proofing has been done in the past by conventional silver halide photography, requiring time-consuming chemical processing of the prints. An improved way of color proofing used electrophotographic techniques. This reduces the time for printing and developing each color separation image and for obtaining the composite proof. An especially useful electrophotographic technique involves forming the color proof image with liquid toners on a thin transparent plastic sheet and then adhering the side of the sheet on which the toner image is printed to a paper support sheet. The resulting color image is covered by the thin protective transparent plastic sheet.

One of the qualities of lithographic press prints that a color print should reproduce or simulate is the quality of dot gain. This occurs in a press run because of the fact that when a half-tone lithographic plate applies liquid ink to a paper sheet or other substrate, the inked dots spread slightly because the liquid ink spreads out when the plate presses against the paper.

When a color image is formed electrophotographically on a transparent plastic sheet and is then applied to paper stock the dots do not spread on the paper as do printing inks because the toner is already dry when the plastic sheet is fixed to the paper. There will, therefore, be a slight but undesirable difference between the appearance of the electrophotographic color proof and the press print. The present invention provides an improvement in the electrophotographic color proofing method to simulate the dot spread or "dot gain" which occurs in press runs.

SUMMARY OF THE INVENTION

The method of the present invention provides electrophotographic pre-press color proofs which simulate the appearance of press prints obtained by liquid ink printing of half-tone dot patterns with half-tone lithographic plates. In the novel method electrophotographic latent images are formed by subjecting a photoconductor to a series of registered exposures through half-tone color separation transparencies which correspond to the lithographic plates for the printing run. The color separation latent images are developed sequentially to obtain a developed composite color proof on a reflective substrate. To improve the fidelity of the color proof, an apparent dot gain for the composite color proof is achieved by forming a lamination which comprises the reflective substrate, the developed half-tone dot pattern and, covering the latter, a transparent thermoplastic sheet having a thickness of at least about 15 μm and a refractive index at least about 1.3.

The novel color proof of the invention which results from the described method is a laminated article comprising a reflective substrate, a developed dot pattern on the substrate, a thin transparent layer covering the dot pattern and a thicker transparent sheet laminated to the thin layer, the thicker sheet having a uniform thickness of at least about 15 μm and a refractive index of at least about 1.3.

THE DRAWINGS

The invention will be described in more detail with reference to the drawings of which FIG. 1 is diagrammatic representation of a greatly enlarged view of a portion of a half-tone dot pattern image.

DETAILED DESCRIPTION

Figure 1:
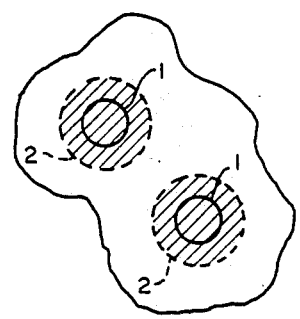

Represented diagrammatically in FIG. 1 is a conventional dot pattern which is formed by printing with liquid inks from a half-tone lithographic plate on a sheet of paper. The solid line circles 1 represent the areas of the individual dots on the lithographic plate. The concentric dotted line circles 2 represent the increased areas of the dots which result when liquid ink from the plate is pressed into contact with the paper in the printing operation. This larger area is called "dot spread" or "dot gain".

Since dot spread is more or less unavoidable in the printing run, in order for a color proof to simulate the press print, some way to cause at least an apparent increase in the dot sizes is desirable. In accordance with the invention it has been found that an apparent increase in the dot sizes can be obtained in the color proof image by laminating over the color proof image a transparent thermoplastic sheet which, for convenience, is referred to as a pad.

The improvement in the color proof achieved by the method of the invention is referred to as "apparent dot gain" because it simulates the appearance of a press print in which actual dot gain has occurred. It is not clear, however, that any actual increase occurs in the size of the dots in the color proof. What can be seen is an increase in the integrated optical density of the half-tone areas of the proof when the pad layer is applied. The density increase corresponds to the density increase caused by dot gain in the printing run.

The method of the invention is particularly useful with a newly developed electrophotographic color proofing method which is disclosed in co-pending U.S.

patent application of Ng et al, Ser. No. 773,528, filed Sept. 6, 1985. An embodiment of the latter is illustrated diagrammatically in FIG. 2.

Figure 2:
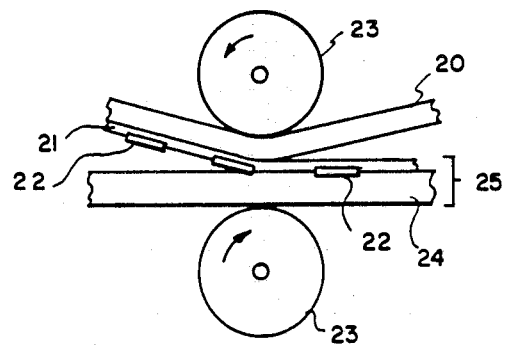
FIG. 2 is a diagrammatic representation of a method of transferring an electrophotographically developed color proof to a paper receiving sheet.

As shown in FIG. 2 a color proof image is formed on a releasable, dielectric, transparent, thermoplastic overcoat sheet 21 covering the surface of a photoconductor 20. The overcoat sheet is very thin, having a thickness, e.g., of 1.5 to 3 μm. The photoconductor is sequentially exposed through a series of registered color separation transparencies, and, after each exposure, the latent image which forms on the releasable overcoat sheet is developed. Then, as illustrated in FIG. 2, the resulting multi-color image is transferred to a receiving sheet such as a sheet of printing stock paper. This is done by placing the composite sheet composed of the photoconductor 20, the thin releasable overcoat layer 21 and the color image 22 on the receiving sheet 24, the toner image side of layer 21 being in contact with the receiving sheet. Heat and pressure are applied, as by passing the assembly through the nip of heated pressure rollers 23 to fuse and laminate the thermoplastic overcoat layer 21 to the receiving sheet 24. After this assembly passes through the nip, the photoconductor is stripped from the releasable surface of the overcoat layer leaving the laminated color proof 25.

Figure 3:
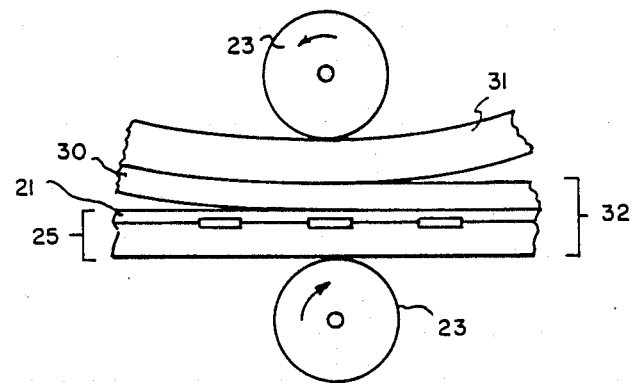
FIG. 3 is a diagrammatic representation of one embodiment of the method of the present invention with a sectional view of a color proof of the invention.

FIG. 3 of the drawing illustrates one embodiment of the method of the invention as applied to the described color proofing method. A transparent thermoplastic sheet or pad 30, which is several times thicker than overcoat layer 21 and is releasably attached to a resin-coated paper sheet 31, placed over the layer 21 of the color proof 25. The pad 30 is then laminated to the layer 21 by passing the assembly through the nip of the heated pressure rollers 23, to fuse the pad to the initial color proof. As the assembly passes through the rollers the releasable resin-coated paper sheet 31 is stripped away, leaving the novel color proof 32.

The novel improved color proof image 32 is shown in section in the right hand portion of FIG. 3. A valuable and unexpected property of this color proof is that the optical density of its half-tone areas is increased, which simulates the density increase caused by dot gain when printing with lithographic plates made from the same color separation transparencies.

The reason for this density increase or apparent dot gain is not well understood. It appears, however, to be an optical phenomenon involving refraction and internal reflection within the pad and is related to the thickness of the transparent pad. A very thin pad, for example, approximately the thickness of the thin transfer sheet provides little or no perceptible dot gain, even though the thin pad is pressed into contact with the image-transfer sheet. This would indicate that the dot gain is not created merely by squeezing the toner between the layers as happens to the ink in the lithographic printing run. Rather, it appears that the apparent dot gain is an optical phenomenon.

While the thickness of the pad layer influences the dot gain, the relationship is not linear. That is to say, simply increasing the pad thickness uniformly does not uniformly increase the dot gain. The apparent dot gain increases as the pad layer thickness increases up to a certain thickness and thereafter no significant dot gain is seen with further increases in pad thickness. The maximum thickness at which no further apparent dot gain is observed is around 20 micrometers (μm). Thicker pad layers can be used in the method of the invention, but with no substantial increase in dot gain.

To obtain optimum benefits of the invention the pad layer should be at least about 15 μm in thickness. Thinner layers can be used but the apparent dot gain will not be as close to the printing run actual dot gain as would be desired for optimum color proofing.

Although FIGS. 2 and 3 show the application of heat and pressure to the thermoplastic assemblies by means of heated pressure rollers, the fusing and lamination of the thermoplastic layers can be accomplished by stationary planar contact instead of by rolling contact. In that event, the heat and pressure necessary for lamination can be applied by a pressure plate and a platen supporting either the receiving sheet or the initial color proof or the thermoplastic pad.

The method of the invention is especially advantageous for use in the so-called "pos-pos" mode of electrophotographic imaging. This is the mode in which a positive image is formed on a photoconductor by exposure through positive color separation transparencies. In the neg-pos mode another method of achieving dot gain is available which is not suitable for the pos-pos mode. Hence the method of the invention for simulating dot gain is especially needed for the pos-pos mode.

The pad layer or sheet used in the method of the invention can be made from a wide range of transparent thermoplastic polymers. Examples of thermoplastic polymers which are suitable for the pad composition include acrylic homopolymers and copolymers such as poly(isobutyl methacrylate) and acrylic-styrene copolymers; vinyl polymers and copolymers such as poly(vinyl acetate), polystyrene, poly(vinyl acetate-co-crotonic acid); poly(vinylidene chloride-co-acrylonitrile), poly(vinyl butyral), poly(vinyl formal) and poly(styrene-co-butadine); polyesters such as poly(ethylene glycol terephthalate) and poly(1,4-butanediol isophthalate); polycarbonates such as bisphenol-A polycarbonate; and cellulosics such as cellulose nitrate, cellulose acetate and cellulose acetate-butyrate.

Whatever thermoplastic polymer is selected, it should be fusible at a reasonable temperature and pressure but should not be so soft that the pad sheets stick to each other or block at normal storage and use temperatures. One way to define this property of the polymer is by its glass transition temperature (Tg). The polymer should have a Tg greater than room temperature (20° C.) to avoid the blocking problem. Then to be fusible at reasonable temperature and pressure its Tg preferably should be below about 120° C. A somewhat higher Tg than 120° C. is acceptable if the pad composition contains a plasticizer for the polymer. This would permit the use of a harder polymer of higher softening point than would otherwise be acceptable.

Although the composition of the pad layer can consist solely of a thermoplastic polymer having the desired physical properties such as Tg, various addenda can be included to provide optimum physical properties. As already mentioned, a plasticizer can be blended with the polymer to soften the composition. This will also reduce the tendency of the plastic to curl.

The particular plasticizer to be used would depend on the polymer being used for the pad, but a large number of plasticizers are available. Examples include the phthalates such as dioctyl phthalate and diphenyl phthalate and they can be used in concentrations from about 5 to 40 and, preferably about 10 to 25 weight percent based on the amount of polymer.

The reflective substrate on which the color proof image is placed can be selected from a wide range of reflective sheet materials. Since the purpose of color proofing is to simulate the expected appearance of a press print, the substrate preferably is whatever stock is intended to be used in the press run. This will include various kinds of paper, e.g., uncoated paper, clay-coated paper and resin coated paper, as well as plastic sheets containing a reflective pigment such as titanium dioxide or others.

Still another possible additive for the pad composition is an optical brightener. Any that are compatible with the other components of the pad and that have the desired absorption and emission wave lengths can be used. Examples include derivatives of 4,4'-diaminostilbene-2,2'-disulfonic acid and coumarin derivatives such as 4-methyl-7-diethylaminocoumarin.

Another useful additive is a surfactant which aids in forming the plastic sheet. Although a number of known methods of forming plastic sheets can be used, the preferred method is to coat a solution of the polymer on a releasable surface, i.e., one of low surface energy to which the polymer will not stick strongly and from which it can easily be peeled. A convenient way to form the plastic sheets is to coat a solution of the polymer, e.g., poly(isobutyl methacrylate) in a volatile solvent, e.g., acetone or methyl ethyl ketone, on a sheet of polyethylene-coated paper or on a sheet of poly(ethylene glycol terephthalate). The solvent evaporates leaving the plastic pad layer on the releasable substrate. To transfer the pad layer to a color proof, the pad coated side of the releasable support is placed on the color proof and laminated to it. Then the releasable support is stripped away. Since the pad layers are thin and fragile, to preform them, store them and use them as separate sheets would be difficult. By forming the pad layer first on a resin-coated paper sheet or on a thicker and tougher plastic sheet, the storage and handling of the pads, including transfer to and lamination with the color proof, is facilitated.

To aid on coating the pad composition on the resin-coated paper or plastic sheet, the addition of a coating aid or surfactant is desirable. Examples of useful coating aids include various silicone compounds of which bisphenol-A-block-co-poly(dimethylsiloxane) adipate, and poly(dimethyl siloxaneco-methyl phenyl siloxane), e.g, DC510 surfactant of Dow Corning, are especially useful for coating acrylic polymers such as poly(isobutyl methacrylate). Suitable concentrations of coating aids are known in the art and can range, for example, from about 0.05 to 0.4 weight percent of the polymer composition.

Still another possible additive for the pad layer composition is a "matte" agent. These agents are fine powders (average particles size in the range from about 1 to 12 $\mu$m) of various high melting polymers or inorganic compounds which can reduce the luster of the pad layer and improve the simulation of the press print. Examples of useful matte agents include polyethylene bead powders, calcium carbonate, titanium dioxide, alumina and polystyrene powder. The concentration of matte agent in the polymer composition is suitably up to about 20 weight percent and preferably about 5 to 10 weight percent.

More importantly, the matte agent can also help to reduce blocking of the pad sheets and can therefore permit the use of polymers of lower Tg than would otherwise be suitable. On the other hand, a plasticizer can permit the use of a polymer that might otherwise have too high a Tg.

Although the use of a matte agent is desirable, it is possible to obtain its effects in other ways. Blocking can be reduced by using a plastic of high Tg, although this then requires a high fusing temperature and may have other disadvantages. Delustering can be accomplished by giving the thermoplastic pad layer a textured surface by casting it on a textured releasable support or, if the pad is not on a support, by using a pressure platen or roller with a textured surface. Thus, the matte agent is not essential but its use provides advantages, especially in preventing blocking.

In referring to the transparent plastic sheets herein, the word transparent is used in a broad sense. It means that the light transmission of the sheet is such that when the sheet is laminated to a toner image, the image can be seen clearly through the sheet. In fact, the transparency is so good that a color proof covered by the plastic sheet simulates closely the appearance of a corresponding press print. However, when viewed separately, the transparent plastic sheets are not necessarily fully transparent. In fact, when the pad contains a matte agent, the separate sheets will have a cloudy or light-scattering appearance.

The placing of the transparent layer over the dot pattern image instead of under it is a significant element of the present invention. If the layer is placed under the image a problem arises when using transparent sheet compositions which have a Tg low enough for lamination by heat and pressure and low enough to be resistant to curl and cracking. The problem is that such a sheet is so soft that when the toner image is laminated to it, the toner may migrate and the image quality will suffer. Surprisingly, in accordance with the present invention, the optical improvement of the image (apparent dot gain) is achieved without contacting the soft transparent pad layer with the toner and distortion of the image is avoided.

Since liquid developers have certain desirable properties, especially their fine particle size which gives good image resolution, they are usually the developers of choice in electrophotographic color proofing. Liquid developers are colloidal suspensions of polymeric toner particles in a volatile, electrically insulating carrier liquid. A leading example of the latter is the isoparaffinic liquid sold under the trademark, Isopar G, by Exxon Corporation of New Jersey. The fine toner particles usually consist of a binder resin, such as a styrene-acrylic copolymer or a polyester, and pigment. The developer can also contain an ionic charge control agent or stabilizer which serves to maintain the electrostatic charge on the toner particles. To render the toner self-fixing, the developer can also contain a dispersion of a wax. An illustration of developers of this kind, with which the method of the present invention is especially applicable, is provided in U.S. patent application Ser. No. 390,487 of Santilli et al, filed June 21, 1982 and in published European Patent Application No. 098,041 A1, published Jan. 11, 1984.

The dots in half-tone image patterns developed by such self-fixing liquid developers do not spread significantly beyond the area of the electrostatic charge which corresponds to the dot area of the half-tone transparency. Hence, the method of the present invention which creates an apparent dot spread is useful with images developed with such liquid developers.

The method of the invention is also useful with half-tone images developed by dry developers. These are known in several forms including single component and two-component dry developers. In both types the image is toned with finely divided dry toner particles. Normally, the latter are thermoplastic pigmented particles which are fixed to the image area by fusing. Some spreading of dots may occur in fusing dry toner particles to a substrate on which a half-tone charge pattern has been developed, but the spread is not normally large enough to equal the spread occurring in lithographic printing. Hence, the method of the present invention applies also to half-tone images developed with dry developers. Examples of such developers are disclosed in the U.S. patent to Jadwin et al, No. Re. 31,072.

The method of the invention is further illustrated by the following examples. The first example describes the preparation of a pad layer for use in the method of the invention.

EXAMPLE 1

A pad coating was prepared in the following manner: 97.2 g. of Elvacite 2045 thermoplastic polymer [poly(isobutyl methacrylate) manufactured by E. I. DuPont de Nemours Inc. of Wilmington, Del.], and 24.3 g. of Santicizer 261 plasticizer (2-ethylhexyl benzyl phthalate manufactured by Monsanto Co. of St. Louis, Mo.) were dissolved by stirring into 615 g. of acetone containing 0.19 g. of surfactant DC-510 (a silicone manufactured by Dow Corning Corp. of Midland, Mich.) using a magnetic stirrer. Dissolution occurred after six hours. 12.13 g. of Polyfluo 190 matte agent (a finely powdered fluorocarbon of 3 micron average particle size manufactured by Micro Powders Inc. of Yonkers, N.Y.) were added to the solution and the mixture stirred overnight. The resulting dispersion (with constant stirring) was coated to form a pad layer about 20 µm thick on the polyethylene side of the polyethylene coated paper using an extrusion hopper.

EXAMPLE 2

Another pad layer was coated on a poly(ethylene terephthalate) film by the procedure of Example 1 but using a blend of poly(vinyl acetateco-crotonic acid) (80 parts) and cellulose nitrate (20 parts) as the polymer and omitting the plasticizer. The solvent was methyl ethyl ketone. The dry pad layer was approximately 18 to 20 µm in thickness.

The next example describes applying a pad layer to a color proof in accordance with the invention.

EXAMPLE 3

The thin transparent thermoplastic sheet bearing an electrophotographically formed color image is transferred from a photoconductive layer to a sheet of clay-coated paper printing stock, with the image side of the sheet in contact with the paper. A thicker thermoplastic pad layer coated on polyethylene-coated paper as in Example 1 is placed over the thinner sheet. Then the sheets are laminated together using a platen laminator having an upper heated metal platen and a lower compliable pressure pad. The pressure contact continues for two minutes at 105° C. and a pressure of 35 psi (24 kPa). After laminating the thicker pad layer over the color proof and stripping away the polyethylene-coated paper, the half-tone areas of the color proof have an integrated optical density increase as measured by a densitometer which is comparable to the density increase caused by physical dot gain in a press print.

EXAMPLE 4

Instead of pressing the layers in a platen press as in Example 3, they are passed through the nip of rolls heated to 102° C. at a nip weight of 75 pounds per linear inch (13 kg/cm), after which the polyethylene coated paper is stripped off, leaving a color proof having apparent dot gain.

This invention has been described in detail with certain preferred embodiments thereof, but it will be understood that variations and modifications can be effected within the spirit and scope of the invention.

We claim:

1. A method of forming electrophotographic pre-press color proofs which simulate the appearance of press prints obtained by printing half-tone dot patterns with half-tone lithographic plates and liquid inks, which comprises:
   subjecting a photoconductive element to a series of exposures through half-tone color-separation transparencies which correspond to the half-tone lithographic plates to obtain electrophotographic latent images,
   developing each latent image sequentially and forming a composite color proof toner image on a thin transparent sheet,
   laminating to a reflective substrate the toner side of the thin transparent sheet bearing the developed image, and laminating to the other side of the thin transparent sheet a thicker transparent sheet;
   said thicker sheet having a uniform thickness of at least about 15 µm and a refractive index of at least about 1.3, and said thin transparent sheet having a thickness no greater than 3 µm.

2. A method according to claim 1 wherein the transparent sheets are thermoplastic.

3. A method according to claim 2 wherein the thicker transparent sheet comprises a polymer having a Tg from about 20° C. to about 120° C.

4. A method according to claim 3 wherein the polymer is poly(isobutyl methacrylate).

5. A method according to claim 2 wherein the thicker sheet contains a plasticizer, a coating aid and a matte agent.

6. A method according to claim 2 wherein the thicker sheet is formed by coating on a releasable support a solution comprising a solvent, a thermoplastic polymer, a plasticizer, a coating aid and a matte agent and evaporating the solvent, and wherein the resulting thicker sheet coated on the releasable support is laminated to the thin transparent sheet and the releasable support is stripped away.

7. A method according to claim 1 wherein both the half-tone transparencies and the color proof image are positive images.

8. A method according to claim 1 wherein the thicker transparent sheet is formed by coating on a releasable support a solution comprising a volatile organic solvent, a poly(alkyl methacrylate) a plasticizer, a coating aid and a matte agent and stripping the resulting sheet from the support.

9. A color proof comprising a reflective substrate, a composite color proof toner dot pattern on the substrate, a thin transparent layer laminated to the substrate and covering the entire composite dot pattern, and a thicker transparent layer laminated to the thin layer, the thicker layer having a thickness of at least about 15 µm and a refractive index of at least about 1.3, and the thin transparent layer having a thickness no greater than 3 µm.

10. A color proof according to claim 9 wherein the thicker transparent layer comprises a poly(alkyl methacrylate), a plasticizer and a matte agent.

* * * * *